United States Patent
Seo et al.

(10) Patent No.: US 6,719,572 B2
(45) Date of Patent: Apr. 13, 2004

(54) JUNCTION BOX

(75) Inventors: Hiroyuki Seo, Mei (JP); Katsuhiro Hosoe, Mie (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 10/200,986

(22) Filed: Jul. 23, 2002

(65) Prior Publication Data

US 2003/0017727 A1 Jan. 23, 2003

(30) Foreign Application Priority Data

Jul. 23, 2001 (JP) ........................................ 2001-222044

(51) Int. Cl.[7] ............................................... H01R 12/00
(52) U.S. Cl. .................... 439/76.2; 439/34; 439/949
(58) Field of Search .................. 439/76.2, 34, 949

(56) References Cited

U.S. PATENT DOCUMENTS

| 4,850,844 | A | * | 7/1989 | Hunting ...................... 425/289 |
| 5,771,575 | A |   | 6/1998 | Onizuka et al. |
| 5,919,055 | A |   | 7/1999 | Hattori |
| 6,152,758 | A | * | 11/2000 | Matsuoka ................... 439/364 |
| 6,431,880 | B1 | * | 8/2002 | Davis et al. ................ 439/76.2 |
| 6,494,722 | B1 | * | 12/2002 | Sakamoto et al. ......... 439/76.2 |

* cited by examiner

*Primary Examiner*—Truc Nguyen
(74) *Attorney, Agent, or Firm*—Harness, Dickey & Pierce, P.L.C.

(57) ABSTRACT

A junction box disposed between a dash panel (P1) of a vehicle body and an installment panel (P2) has a plurality of boxes (11, 12) removably connected to each other by overlapping the boxes (11, 12) on each other. A fuse (30, 31) and/or a relay (41) accommodation portion is provided on one surface of each of the boxes (11, 12). In this construction, in an overlapped state, same-side surfaces of the fuse (30, 31) and/or relay (41) accommodation portions of the boxes (11, 12) are exposed to the outside. Internal circuits of the overlapped boxes are connected to each other through a connector (26, 45) a relay terminal or bolted terminal.

7 Claims, 11 Drawing Sheets

JUNCTION BOX

CROSS-REFERENCE TO RELATED APPLICATION

This application claims priority to Japanese Patent Application No. 2001-222044 filed Jul. 23, 2001, which application is herein expressly incorporated by reference.

FIELD OF THE INVENTION

The present invention relates to a junction box mounted on a vehicle body. More particularly, the present invention relates to a junction box, disposed between a dash panel and an installment panel, where fuses and relay replacements may be easily accomplished with high workability in a reasonable maintenance time. The present invention also relates to a compact junction box that can be connected to a wire harness with high operability

BACKGROUND OF THE INVENTION

In the conventional art, two kinds of wire harnesses, namely, an installment panel harness and a cowl harness are disposed between an installment panel of a vehicle and a dash panel at the vehicle-body side. A power-source line, a signal line, and a ground line are present in each of the installment panel harness and the cowl harness. The junction box to be connected to the wire harness is assembled by connecting it to the installment panel harness or the cowl harness through a connector.

The cowl harness is disposed along a dash panel in an assembly line of a vehicle and fixed with a clamp. The installment panel harness is disposed along the installment panel and fixed with a clamp. In this state, the installment panel is installed on the dash panel. A front harness, a floor harness, a roof harness, and a door harness connector is fitted on a connector fit-on portion of a junction box connected to the installment panel harness or the cowl harness. Further a connector of the installment panel harness or the cowl harness at the side not connected to the junction box is fitted on the connector fit-on portion of the junction box. After required connectors are all fitted on the junction box, the junction box is fixed to the dash panel.

As described above, the power-supply line, the signal line, and the ground line are present in each of the installment panel harness and the cowl harness that are disposed on the installment panel and the dash panel. Further the wire harnesses and the junction box connected to the wire harnesses are also large. Thus, a large junction box-installing space is required. Also, it is difficult to install the junction box on the dash panel.

In connecting a large number of connectors to the junction box, it is necessary for an operator to extend her/his hand from below to a dark space sandwiched between the dash panel and the installment panel. The operator is crouching and stooping during installation. Thus, this operation is a physical burden on the operator. Further because it is necessary to connect the floor harness, the front harness, the roof harness, the door harness, and the installment panel harness or the cowl harness to the junction box, it is necessary to connect a large number of connectors on the junction box. Thus it takes a substantial amount of time to perform the connector connection operation.

To overcome the above-described problem, the present applicant proposed a junction box 1 as disclosed in Japanese Patent Application Laid-Open No. 9-154216 and as shown in FIG. 13. The junction box 1 is divided into a first junction box 2, with a common power-supply circuit, a ground circuit, and a high-current power supply circuit branch-connected to the common power-supply circuit and the ground circuit. The second junction box 3 has the low-current circuit which includes the signal circuit. The first junction box 2 and the second junction box 3 have the batch fit-on connector portions 2a and 3a, respectively. The relays and the fuses are mounted on the first junction box 2. The first junction box 2 is mounted on the installment panel P1 to connect it to the installment panel harness W/H1. The second junction box 3 is mounted on the dash panel P2. Further the junction box 1 has a plurality of harness/connector portions 3b that connect with the front harness, the floor harness, the roof harness, and the door harness.

The large junction box 1, which is later fixed to the dash panel, is divided into the high-current circuit and the low-current circuit to form the first junction box that is mounted on the installment panel in advance and the second junction box that is mounted on the dash panel in advance. Thus the internal circuit of each junction box has a simple compact construction. Further the first junction box and the second junction box are mounted on the installment panel and the dash panel, respectively, before the installment panel is mounted on the dash panel. Since the electrical connection is made when the installment panel is mounted on the dash panel, the junction box 1 has a function similar to that of a conventional junction box.

Through connectors, other wire harnesses are connected to the second junction box which is to be mounted on the dash panel. Thus, upon engagement of the batch fit-on connector portions, which are to be fitted on the first and second junction boxes, the installment panel harness can be connected to other wire harnesses. As described above, because of the connection between the first and second junction boxes, a batch connection between the installment panel harness and other wire harnesses can be achieved. Therefore the junction box proposed by the present invention enables the connector fit-on operation to be accomplished in a smaller number of processes than the conventional connector fit-on operation.

However, due to the disposition of the junction box between the dash panel and the installment panel it makes it difficult to perform maintenance work. In particular, where a large number of fuses and relays are used, the fuses and relays are mounted on both surfaces of each of the upper case and the lower case. Thus, it is difficult to perform a replacement operation of the fuses and the relays.

The internal circuit of the junction box is composed of bus bars. Thus, it is necessary to produce bus bars which depend on a circuit alteration, which increases the manufacturing cost. Further when a high-density circuit is required, the number of the bus bars increases and in turn, the junction box becomes large. Because the space between the dash panel and the installment panel is small, a large space is required to install the junction box. Furthermore because the junction box is connected to a wire harness of an external circuit through connectors, the number of component parts increases and numerous assembling stages are required in an assembling work, and so forth.

SUMMARY OF THE INVENTION

The present invention has been made in view of the above-described shortcomings of the art. Accordingly, it is a first object of the present invention to provide a junction box, disposed between a dash panel and a installment panel. Replacement of fuses and relays can be easily accomplished in a reasonable maintenance time. It is a second object of the present invention to provide a junction box capable of coping with a circuit alteration and having a small number of component parts and assembling stages.

Accordingly, the present invention includes a junction box disposed between a dash panel of a vehicle body and an installment panel. The junction box has a plurality of boxes removably connected to each other by overlapping the boxes on each other. A fuse and/or a relay accommodation portion is provided on one surface of each of the boxes.

In this construction, in an overlapped state, same-side surfaces of the fuse and/or relay accommodation portions of the boxes are exposed to the outside. Internal circuits of the overlapped boxes are connected to each other through a connector, a relay terminal or bolted terminal.

A plurality of boxes means the upper case and the lower case each accommodate an internal circuit. Unlike conventional junction boxes which have one box, the junction box of the present invention is divided into a plurality of boxes. Thus, circuits connected to electric component parts mounted on the installment panel are collectively accommodated in one box. Other circuits are collectively accommodated in another box. Therefore when circuit construction of the installment panel is altered, only the box for the circuit of the installment panel is altered. Thus the junction box is capable of easily coping with a circuit alteration.

By providing a plurality of boxes, it is possible to form the fuse and/or relay accommodation portion, with the same-side surfaces of the fuse and/or relay accommodation portions of the boxes exposed to the outside in an overlapped state. Thus, an operator can replace the fuses and the relays in only one direction at maintenance time.

Further the fuse accommodation portion and the relay accommodation portion are formed on one surface of each of the overlapped boxes. Therefore the horizontal sectional area of the junction box is not large. Further since a plurality of boxes are combined with each other, it is easy to conform the entire outer configuration of the junction box to the configuration of an installing space by varying the configuration of each box.

More specifically, the boxes are overlapped stepwise in two layers. The fuse and/or relay accommodation portion of each layer is disposed vertically. The fuse and/or relay accommodation portion confronts an opening/closing portion formed on a vertical frame portion of the installment panel.

In this construction, when an operator opens the opening/closing portion of the installment panel, the fuse-disposed surface and the relay-disposed surface of each of the upper and lower boxes confronts the opening/closing portion. Therefore the operator can easily accomplish maintenance which includes replacement of the fuses and relays.

In overlapping the upper box and the lower box on each other, fuses and/or relays to be mounted on the upper and lower boxes are separately disposed. Thus, a fuse and/or a relay mounted in the fuse and/or relay accommodation portion of the upper box are installed on a circuit connected to an electric component part mounted on the installment panel. A fuse and/or a relay mounted in the fuse and/or relay accommodation portion of the lower box are installed on a circuit connected to an electric component part other than the electric component part mounted on the installment panel.

As described above, depending upon the destination of a circuit to which fuses and relays are connected, fuses and relays are separately disposed on the upper and lower boxes.

In this case, it is easy to find the box on which the fuse and/or relay which requires replacement is mounted. Also, it is easy to find the circuit to which the box requires inspection and repair is connected. Thus, high workability can be obtained in a reasonable maintenance time.

A bus bar and an electric wire are used as an internal circuit of the lower box. The internal circuit is connected to a power-supply line. A fuse and a relay of the lower box are connected to the bus bar and a wire harness inserted into the lower box without using a connector. A bus bar and a flat harness are used as an internal circuit of the upper box accommodating a printed wiring board. The bus bar and the flat harness are connected to a fuse, a relay, and the printed wiring board of the upper box. The flat harness is taken out to the outside from the upper box without using a connector to use the flat harness as an external wire harness.

Both upper and lower boxes are connected to an external wire harness without using a connector. Thus it is possible to reduce the number of component parts and improve workability in assembling the junction box. Further, numerous bus bars are not used for the internal circuit of the junction box. Electric wires and flat harnesses are utilized as the internal circuit of the junction box. Therefore the junction box is easily capable of coping with a circuit alteration.

The lower box is installed on the dash panel. The upper box is installed on the installment panel. In mounting the installment panel on the dash panel, the upper and lower boxes are connected to each other. The box may be loosely mounted on the dash panel or the installment panel. In this case, positions of the upper and lower boxes are adjusted and then the upper and lower boxes are connected to each other. Also, it is also possible to connect the upper and lower boxes to each other and then mount them on one of the panels.

In order to simultaneously mount the installment panel on a dash board and connect the upper and lower boxes to each other, connectors on the upper box and the lower box are movably fitted on each other through an elastic supporting member by utilizing a clearance between connector housings of the upper box and the lower box. When the upper box and the lower box are connected to each other, positions of the connectors are automatically adjusted.

In the case where the positions of the upper and lower boxes are adjusted and then the upper and lower boxes are connected to each other; and in the case where the operation of connecting the upper and lower boxes to each other is performed separately from the operation of fixing the installment panel and the dash panel to each other; connectors of the upper box and the lower box fit on each other when the upper box and the lower box are connected to each other with a lever or when the upper box and the lower box are connected to each other with a bolt.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

A junction block according to an embodiment of the present invention will be described below with reference to the drawings.

Figure 1:
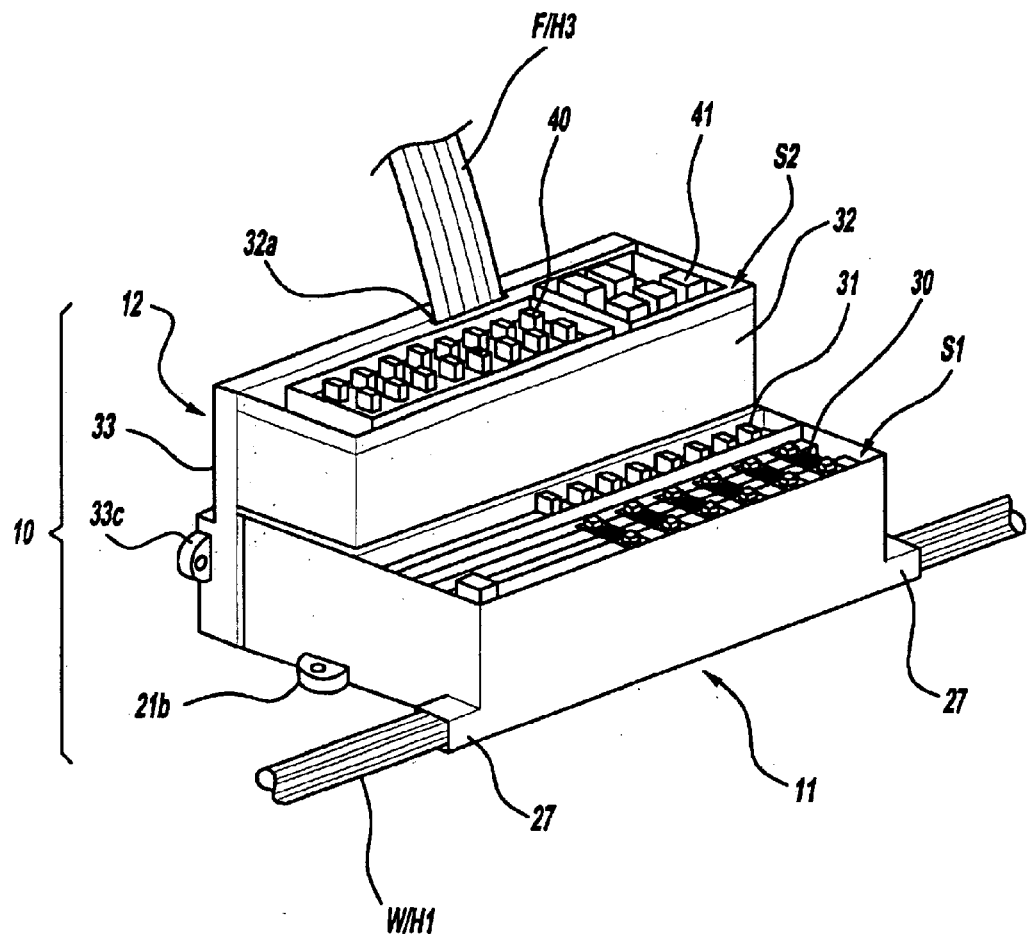
FIG. 1 is a perspective view showing a junction box according to a first embodiment of the present invention.

As shown in FIG. 1, a junction box 10 has two boxes 11 and 12. The box 11, with a larger sectional area, and the box 12, with a smaller sectional area, are fixed to each other. The box 12 overlaps the box 11 to form a stepped configuration as seen in FIG. 1. In the overlapped state, an upper surface S1 of the box 11, in FIG. 1, includes a fuse/relay accommodation portion exposed to the outside. An upper surface S2, in FIG. 1, on which a fuse/relay accommodation portion is disposed is also exposed to the outside.

Figure 2:
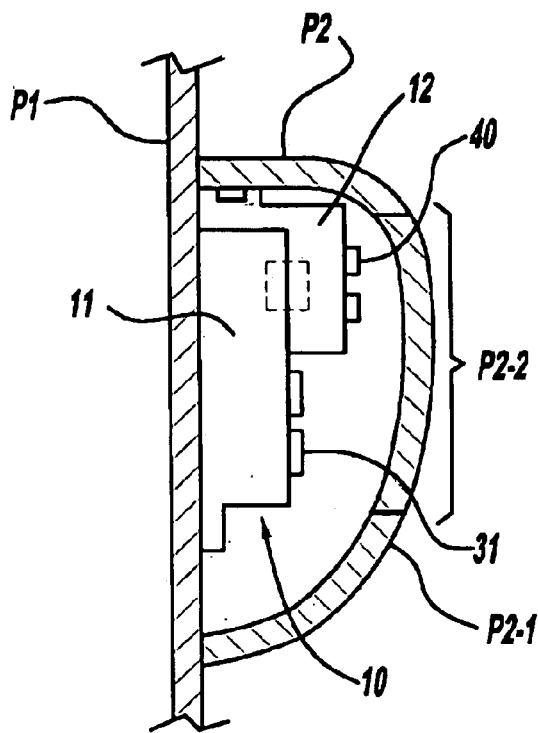
FIG. 2 is a cross-section view of the junction box of the first embodiment installed on a vehicle body.

As shown in FIG. 2, the lower box 11 is fixed to a dash panel P1. The upper box 12 is fixed to an installment panel P2. Thus the surface S1 of the box 11 and the surface S2 of the box 12 become vertically positioned. An opening/closing portion P2-2 is formed on a vertical frame portion P2-1 of the installment panel P2 opposing the surfaces S1 and S2. Thus, in order to replace fuses 40 and relays 31, it is not necessary to remove the junction box 10 from the dash panel P1 and the installment panel P2. Only the opening/closing portion P2-2 is merely opened. Thus, high workability can be obtained during maintenance time.

Figure 3:
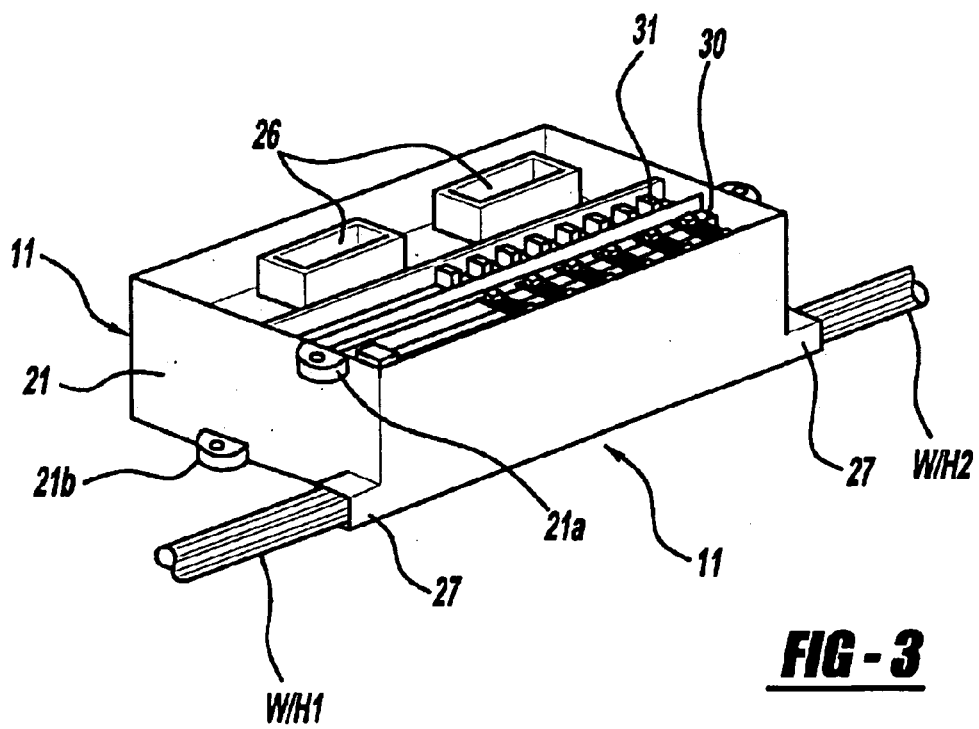
FIG. 3 is a perspective view of a lower box.
Figure 4:
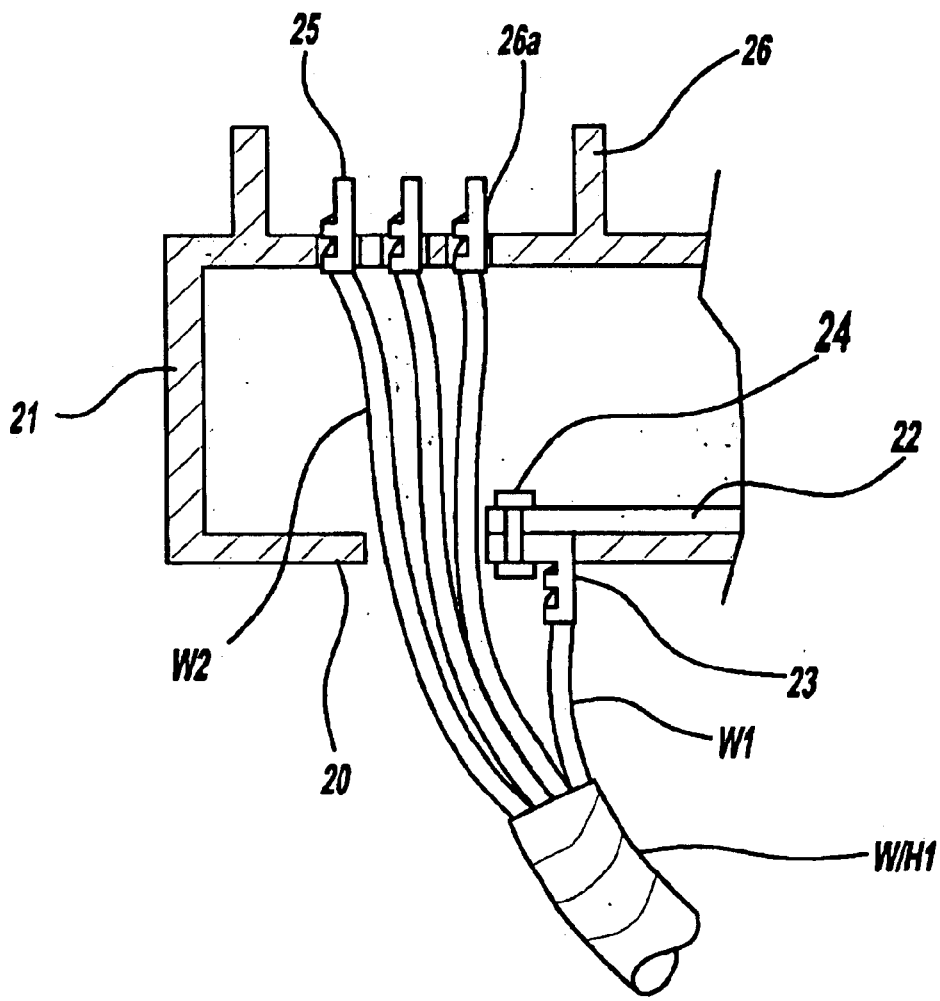
FIG. 4 is a partly broken away sectional view of the lower box of FIG. 3.

The lower box 11 has a construction shown in FIGS. 3 and 4. A wire harness W/H1, extending from a power-supply side, is inserted into a casing which includes a lower case 20 and an upper case 21. A terminal 23 at an end of an electric wire W1 of the wire harness W/H1 is connected, via a bolt 24, to a bus bar 22 disposed in the casing. Electric wire W2 passes through the box 11 and extended to the box 12. A connector is formed with a terminal 25 passing into a terminal opening 26a of a male connector housing 26. The male connector housing 26 is formed on one-side of a horizontal surface of the upper case 21. The terminal 25 is locked into the terminal opening 26a.

Wire harness insertion openings 27 are formed at both lower ends of the peripheral wall. The wire harness W/H1 is inserted into the casing from the wire harness insertion opening 27 at one side of the casing. The wire harness W/H2 is inserted into the wire harness insertion opening 27 at the other side of the casing. The wire harness W/H2 is to be connected to an electric component part other than an electric component part to be mounted on the installment panel.

Portions for mounting a plurality of fuses 30 for large current capacity and portions for mounting a plurality of fuses 31 for small current capacity are arranged side by side on the other-side of the horizontal surface of the upper case 21. An input side of each of the fuses 30 and 31 at a power-supply side is connected to the bus bar 22. An output side of each of the fuses 30 and 31 at a load-applied side is connected to an electric wire W3 of the wire harness W/H1.

Figure 5A:
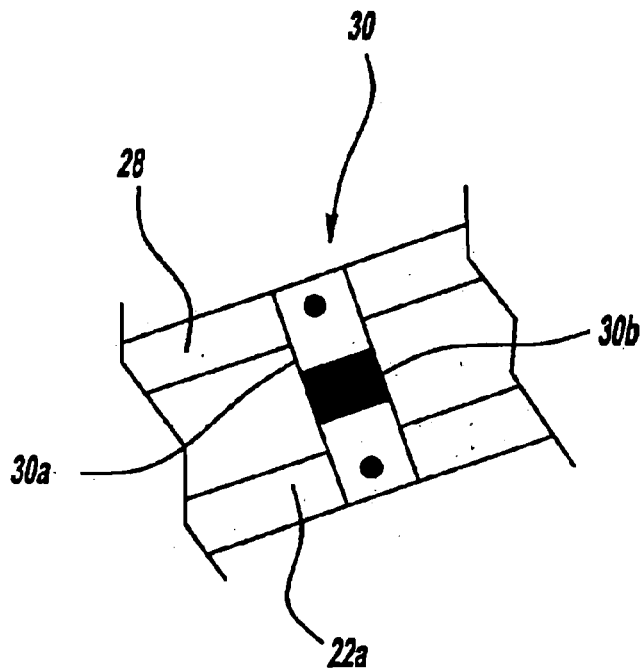
FIG. 5A is a plan view of a connection mode of a fuse for a large current capacity.
Figure 5B:
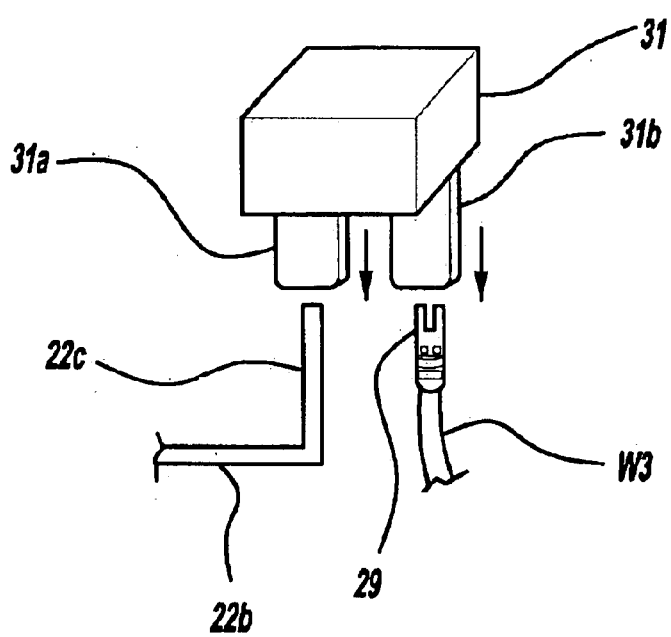
FIG. 5B is a perspective view of a connection mode of a fuse for a small current capacity.

The fuse 30 has an end of a fuse plate 30a fixed, via a screw, to a bus bar 22a connected to a power-supply wire as shown in FIG. 5A. The other end of the fuse plate 30a is fixed to a bus bar 28. The bus bar 28 is connected to the electric wire W3 of the wire harness W/H2. A fusion portion 30b is formed at the center of the fuse plate 30a.

The fuse 31 has an input-side terminal 31a which is pressed against a pressing contact blade-provided tab 22c. The tab 22c is bent from a bus bar 22b or against a relay terminal connected to the tab 22c. Further a male terminal 29, connected to the electric wire W3 of the wire harness W/H2, is pressed against a load-applied side terminal 31b.

As described above, the lower box 11 accommodates the bus bar as the circuit connected to the fuse. The bus bar is connected to the input side of each of the fuses 30 and 31. The output side of each of the fuses 30 and 31 is connected to the electric wire W3 of the wire harness W/H2. The wire harness W/H2 is connected to the circuit of the electric component part other than the circuit of the electric component part to be mounted on the installment panel. Thus the fuses 30 and 31 of the box 11 are used for a circuit other than the circuit for the electric component part to be mounted on the installment panel.

Figure 6A:
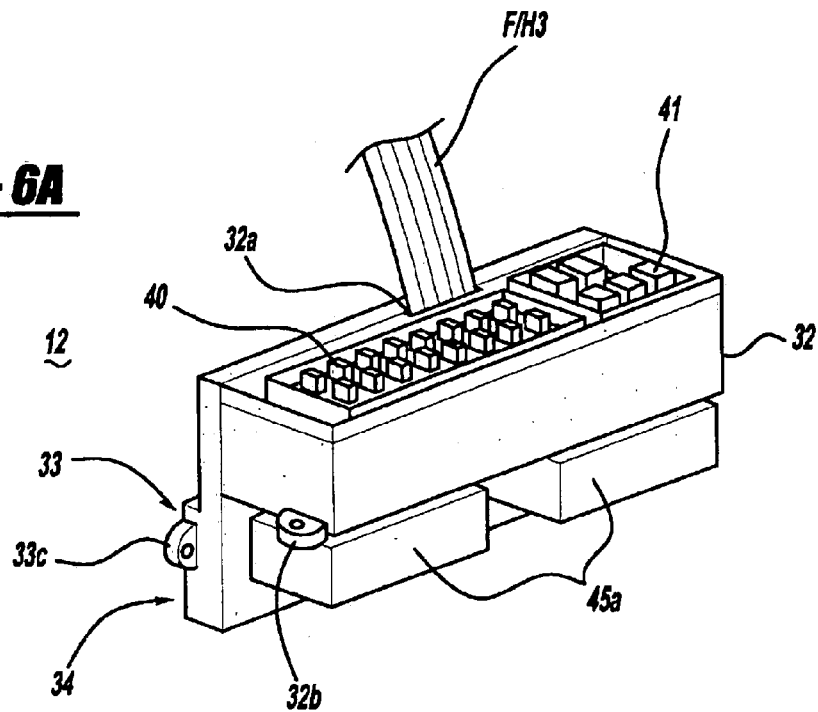
FIG. 6A is a perspective view of an upper box.
Figure 6B:
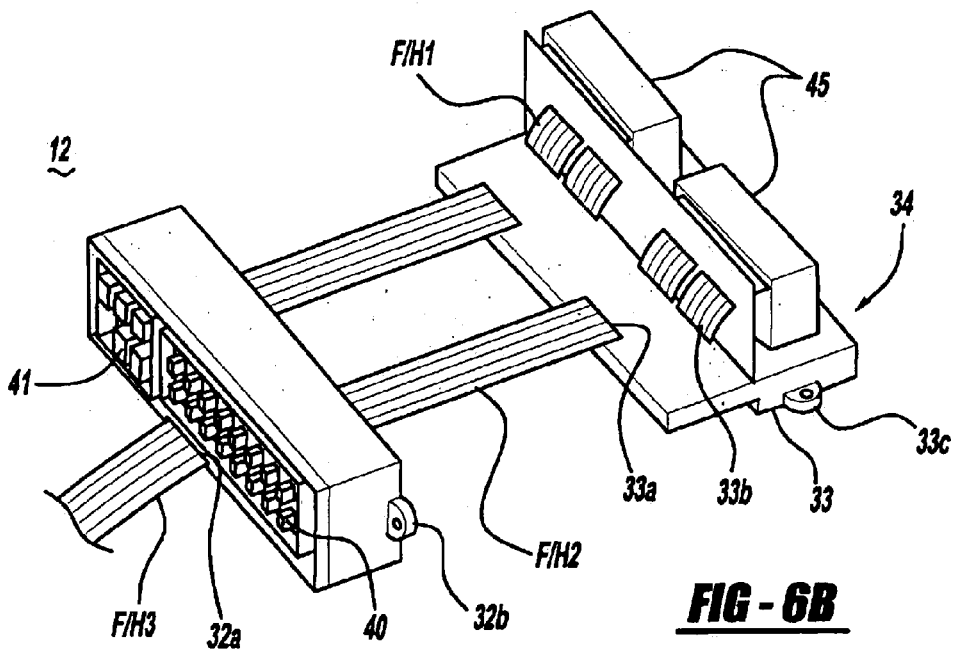
FIG. 6B is an exploded perspective view of the upper box.

The upper box 12 has a construction shown in FIGS. 6A and 6B. The upper box 12 has a first case 32 and a second case 34. A flat harness F/H1 is connected to a terminal 46 inside a female connector housing 45. The flat harness F/H1 is inserted into a printed wiring board accommodation portion 33 through a slit 33b. The other end of the flat harness F/H1 is connected to a printed wiring board 35 inside the printed wiring board accommodation portion 33. One end of a flat harness F/H2 is connected to the printed wiring board 35 inside the printed wiring board accommodation portion 33 through a slit 33a. The other end of the flat harness F/H2 is connected to an input side of a fuse 40 or a relay 41. A flat harness F/H3 has one end connected to a load-applied side of the fuse 40 or the relay 41. Flat harness F/H3 is inserted through a slit 32a of the first case 32 and taken out to the outside without using a connector A portion for mounting a plurality of fuses 40, for small current capacity, and a portion for mounting a plurality of relays 41 are arranged side by side on a surface of the first case 32. The flat harnesses F/H1, F/H2, and F/H3 are accommodated in an internal space formed with the first case 32 and the second case 34.

Figure 7:
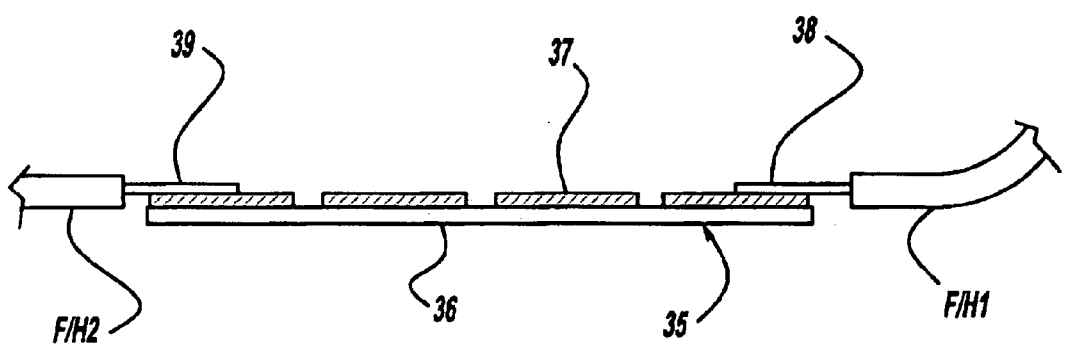
FIG. 7 is a plan view of a connection mode of a printed wiring board.

As shown in FIG. 7, describing the printed wiring board 35, an electric conductor 37 is printed on one surface of a substrate 36. Electronic component parts (not shown) are mounted on the substrate. An electric conductor 38, exposed at one end of the flat harnesses F/H1, and an electric conductor 39, exposed at one end of the flat harnesses F/H2, are connected to the electric conductor 37 of the printed wiring board 35 by soldering (or welding).

Figure 8A:
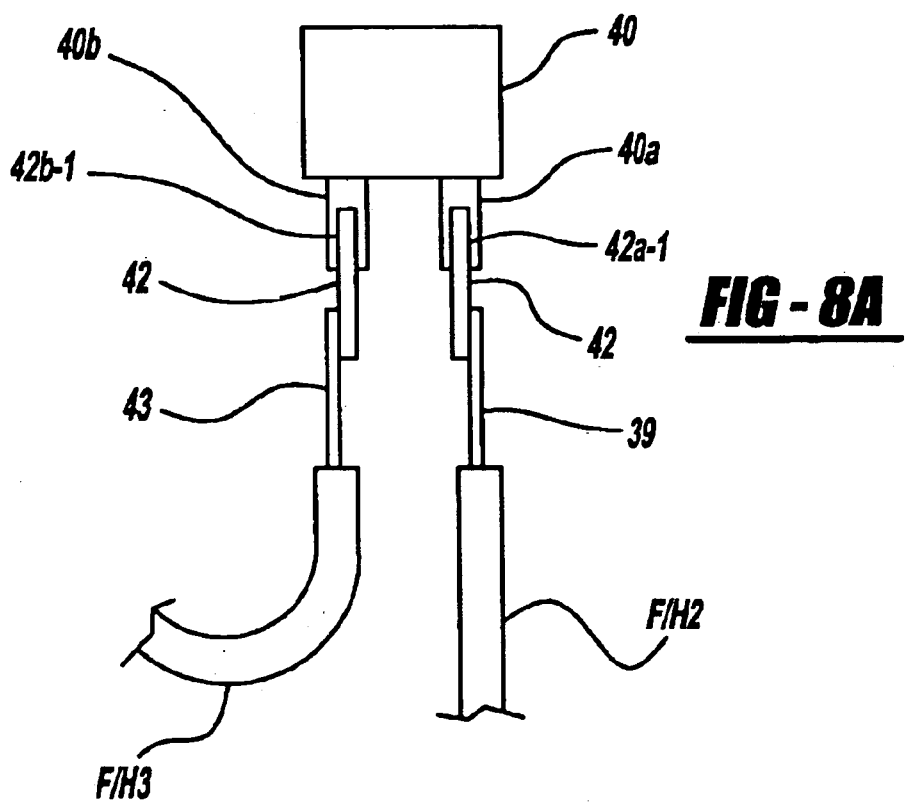
FIG. 8A is a plan view of a connection mode of a fuse of the lower box.

As shown in FIG. 8A, the fuse 40 has a terminal 42 at one side. The terminal 42 is pressed against the electric conductor 39 which is soldered (or welded or pierced) to the flat harnesses F/H2. The leading end of the terminal 42 may be formed as pressing contact blades 42a-1 and 42b-1. Otherwise the terminal 42 may be a female terminal having a spring-like contact.

Figure 8B:
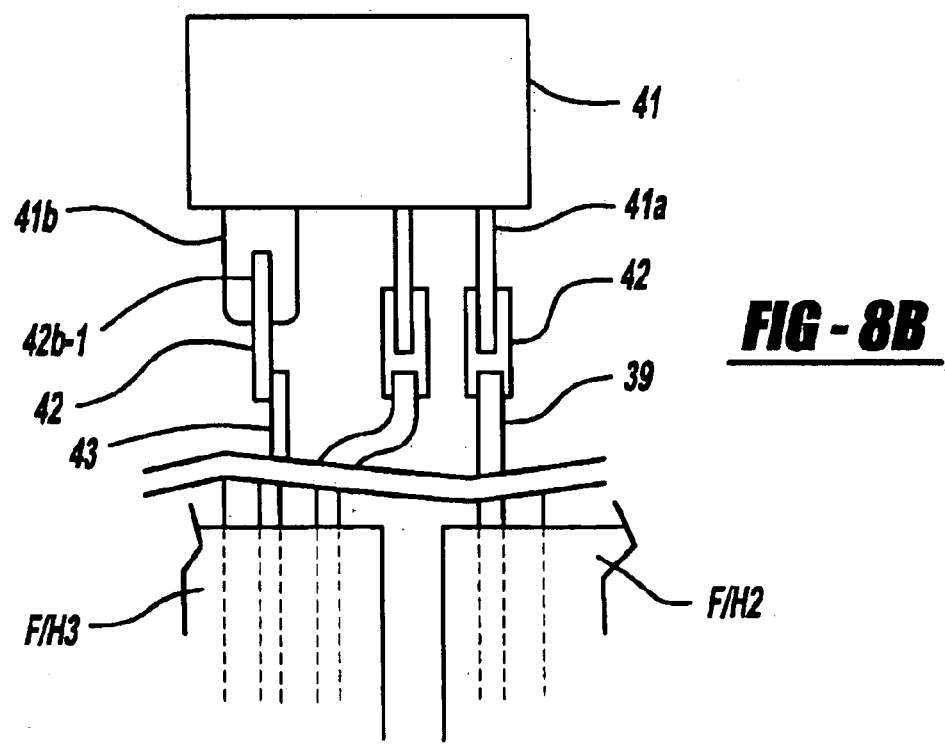
FIG. 8B is a plan view of a connection mode of a relay.

As shown in FIG. 8B, the relay 41 has an input-side terminal 41a pressed against the terminal 42. The terminal 42 is soldered (or welded) to the electric conductor 39 at one end of the flat harness F/H2. A load-applied side terminal 41b of the relay 41 is pressed against the terminal 42. The terminal 42 is soldered (or welded or pierced) to an electric conductor 43 disposed at one end of the flat harness F/H3.

The female connector housing 45 has a terminal 46. The terminal 46 is soldered (or welded) to the electric conductor 38 at one end of the flat harness F/H1. The terminal 46 is inserted into a terminal hole 45a of the female connector housing 45 and locked thereto. The terminal 46 may be crimped to the electric conductor 38 by means of piercing.

Figure 9:
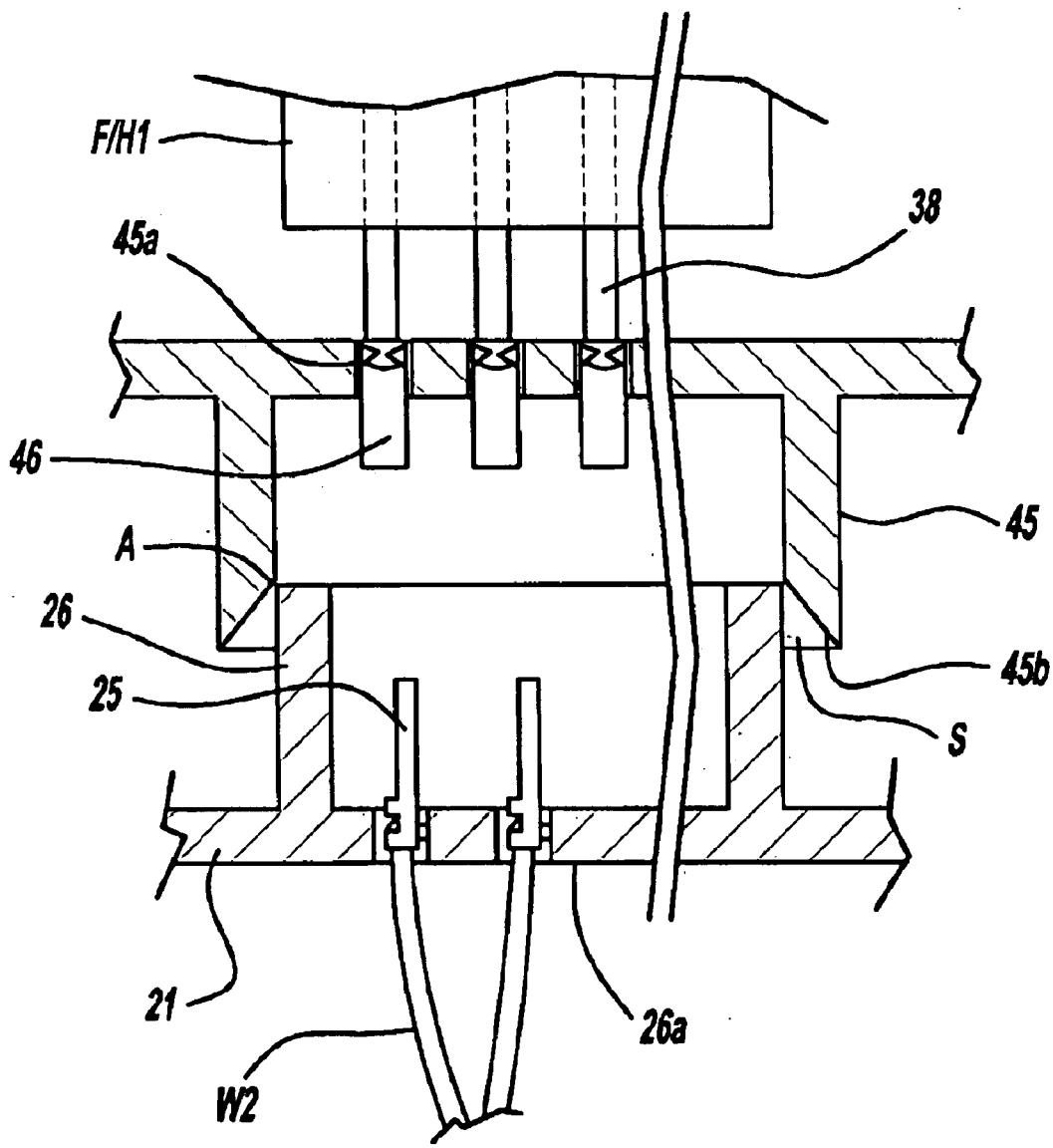
FIG. 9 is a sectional view showing fit-on of connectors of boxes.

A tapered guide portion 45b is formed at the leading end of the female connector housing 45. A clearance S is at the leading end of both housings 26 and 45 when the female connector housing 45 and the male connector housing 26 of the lower box 11 are fitted on each other. Therefore a low extent of a dislocation between the male connector housing 26 and the female connector housing 45 can be automatically corrected. This is due to the fact that the guide portion 45b guides the leading end of the male connector housing 26, as shown with a reference symbol A of FIG. 9. Thus both housings 26 and 45 can be connected to each other with a low degree of force.

In the embodiment, the female connector housing 45 is fixed to the second case 34. However it is preferable to mount the female connector housing 45 on the second case 34 slightly movably through an elastic supporting member. Thus, a dislocation of connectors can be absorbed easily when the connectors fit on each other.

Figure 10:
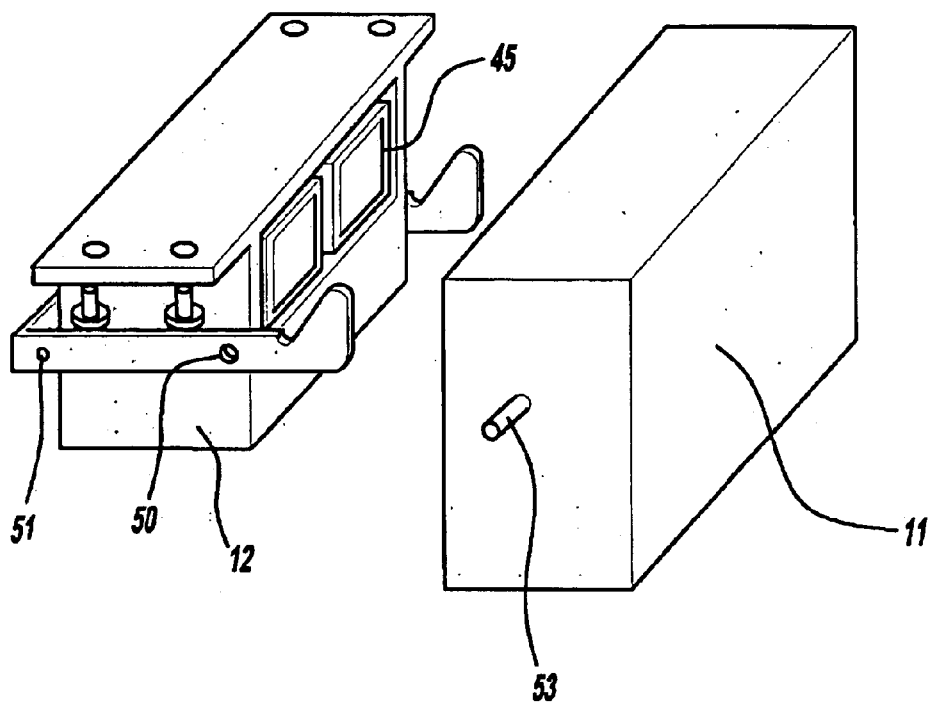
FIG. 10 is a perspective view of a junction box according to a second embodiment of the present invention, depicting portions of boxes which are connected to each other with a lever.
Figure 11:
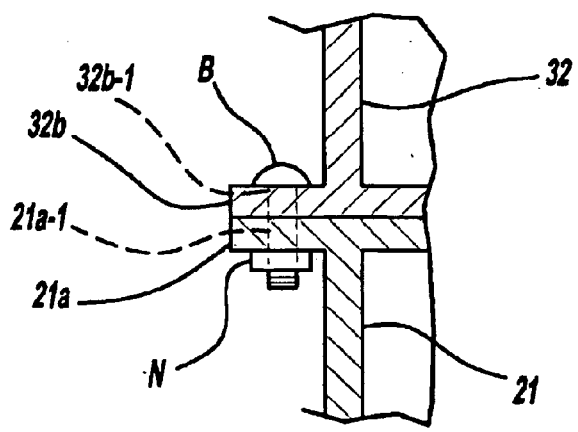
FIG. 11 is a cross-section view of a junction box according to the second embodiment of the present invention, depicting portions of boxes which are connected to each other with a bolt.

FIG. 10 shows a second embodiment. Here, the lower box 11 and the upper box 12 are connected to each other with a lever. By connecting both boxes 11 and 12 to each other with the lever, the female connector housing 45 and the male connector housing 26 fit on each other.

More specifically, a pin 50 projects from right and left side walls of the upper box 12. The pin 50 is rotatably mounted in a rotary pin hole 51b at both sides of an operation lever. A fan-shaped cam member 51a, having a locking concavity 51c, is formed on the lever 51. A cam pin 53, to be locked to the locking concavity 51c, projects from right and left side surfaces of the lower box 11. The boxes 11 and 12 are connected to each other by inserting the lower box 11 between the upper box 12 and the operation lever 51; rotating the operation lever 51 with the cam pin 53 placed on the fan-shaped cam member 51a; and dropping the cam pin 53 to the locking concavity 51c.

The lower box 11 is movably mounted on the installment panel P2 in such a way as to absorb a dislocation. A guide for appropriately correcting a dislocation of the upper box 12 is formed on the lower box 11.

The lower box 11 is fixed to the dash panel P1 at a bracket portion 21b with a bolt. The upper box 12 is fixed to the installment panel P2 at a bracket portion 33c. Thus in an operation of mounting the installment panel P2 on the dash panel P1, the lower box 11 and the upper box 12 are connected to each other by using the lever 51 to thereby fit connectors of the lower box 11 and the upper box 12 on each other. It is possible to fix only the lower box 1 to the dash panel P1, connect the upper box 12 to the lower box 11, and then fix the installment panel P2 to the dash panel P1.

Figure 12:
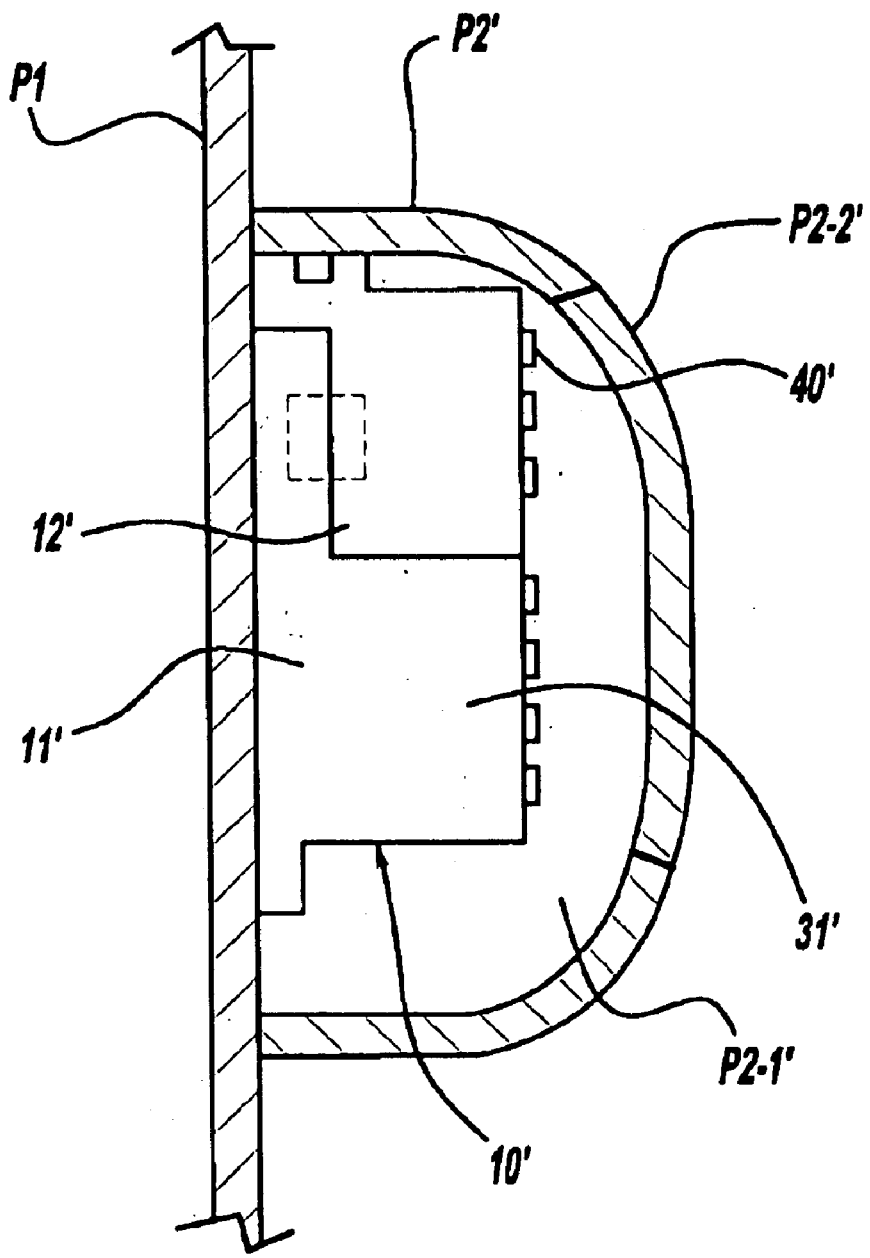
FIG. 12 is a cross-section view of a junction box according to a third embodiment of the present invention with the junction box mounted on a vehicle body.
Figure 13:
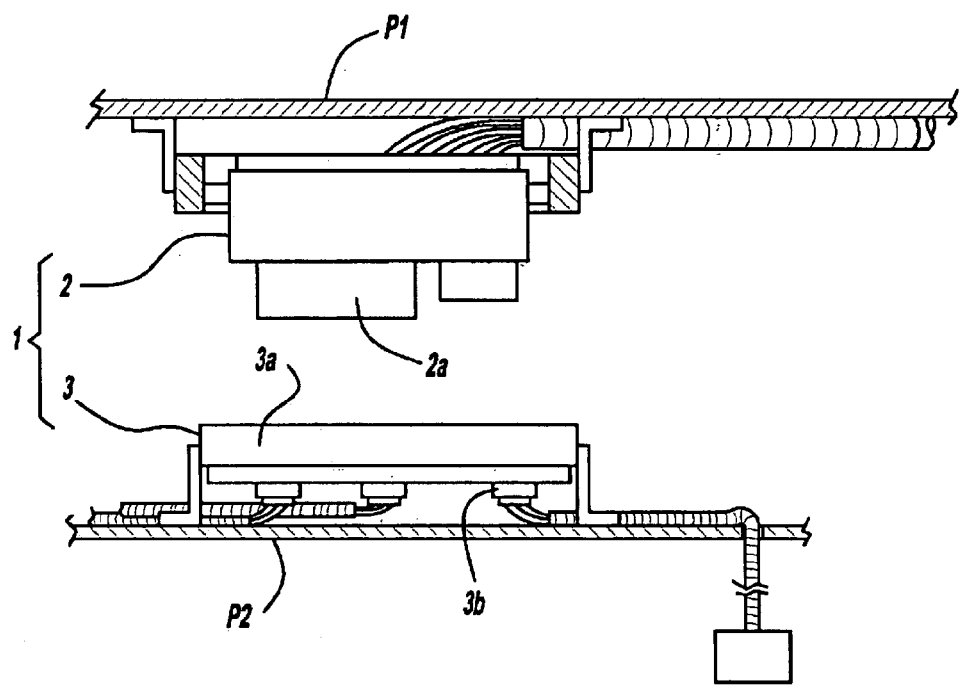
FIG. 13 is a partly enlarged sectional view of a conventional electric connection box.

FIG. 12 shows a third embodiment. In the first embodiment, the junction box 10 is sectionally L-shaped as shown in FIG. 2. However, in the third embodiment, the junction box 10 is approximately rectangular in section.

As shown in FIG. 12, in the case where a vertical frame portion P2-1' of the installment panel P2' is flat, the junction box 10 can be accommodated in the space between the installment panel P2' and the dash panel P1. Here, the junction box 10 is approximately rectangular in section. In this case, since the junction box 10 has a large volume, it can accommodate a large number of circuits.

The surface on which fuses 40' and relays 31' are disposed, opposes an opening/closing portion P2-2'. Thus replacement of the fuses 40' and the relays 31' can be easily accomplished in a reasonable maintenance time.

As apparent from the foregoing description, the junction box of the present invention is divided into a plurality of boxes. Thus, circuits connected to electric component parts mounted on the installment panel are collectively accommodated in one box. Other circuits are collectively accommodated in another box. Therefore, when the construction of the circuit is altered, only the corresponding box is altered.

By providing a plurality of boxes, it is possible to form the fuse and/or relay accommodation portion with the same-side surfaces of the fuse and/or relay accommodation portions of the boxes exposed to the outside in an overlapped state. Thus, an operator can replace the fuses and the relays in only one direction in a reasonable maintenance time. Further by positioning the fuse and/or relay accommodation portion and the opening/closing portion of the installment panel opposing one another, the operator can replace the fuses and the relays with higher workability in a reasonable maintenance time.

It is easy to confirm the entire outer configuration of the junction box to the configuration of an installing space by varying the configuration of each box. Depending on the destination of a circuit to which fuses and relays are connected, fuses and relays are separately disposed on the upper and lower boxes. In this case, high workability can be obtained in a maintenance time.

Both upper and lower boxes are connected to an external wire harness without using a connector. Thus, it is possible to reduce the number of component parts and improve workability in assembly the junction box. Further, many bus bars are not used for the internal circuit of the junction box but electric wires and flat harness are utilized as the internal circuit of the junction box. Therefore, the junction box is easily capable of coping with a circuit alteration.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A junction box disposed between a dash panel of a vehicle body and an installment panel comprising:

a plurality of boxes removably connected to each other in an overlapping configuration of said boxes on each other such that said overlapping boxes are electrically coupled with one another in said overlapping configuration;

a fuse and/or a relay accommodation portion provided on one surface of each of said boxes and in an overlapped state, same-side surfaces of said fuse and/or relay accommodation portions of said boxes being exposed to outside; and internal circuits of said overlapped boxes being connected to each other through a connector, a jumper terminal or bolted terminal.

2. A junction box according to claim 1, wherein said boxes overlap one another in a stepwise two layers configuration; and said fuse and/or relay accommodation portion of each layer is disposed vertically, with said fuse and/or relay accommodation portion opposing an opening/closing portion formed on a vertical frame portion of said installment panel.

3. A junction box according to claim 1, wherein fuses and/or relays mounted on upper and lower boxes are separately disposed, such that a fuse and/or a relay mounted in said fuse and/or relay accommodation portion of said upper box are installed on a circuit connected to an electric component part mounted on said installment panel, and a fuse and/or a relay mounted in said fuse and/or relay accommodation portion of said lower box are installed on a circuit connected to an electric component part other than said electric component part mounted on said installment panel.

4. A junction box according to claim 2, wherein a bus bar and an electric wire are used as an internal circuit of said lower box, said internal circuit is connected to a power-supply line; and a fuse and a relay of said lower box are connected to said bus bar and a wire harness inserted into said lower box without using a connector; and a bus bar and a flat harness are used as an internal circuit of said upper box accommodating a printed wiring board, said bus bar and said flat harness are connected to a fuse, a relay, and said printed wiring board of said upper box, and said flat harness is taken out to the outside from said upper box without using a connector to use said flat harness as an external wire harness.

5. A junction box according to claim 1, wherein connectors of an upper box and a lower box are movably fitted on each other through an elastic supporting member by utilizing a clearance between connector housings of said upper box and said lower box, and when said upper box and said lower box are connected to each other, positions of said connectors are automatically adjusted.

6. A junction box according to claim 1, wherein connectors of an upper box and a lower box fit on each other when said upper box and said lower box are connected to each other with a lever.

7. A junction box according to claim 1, wherein connectors of an upper box and a lower box fit on each other when said upper box and said lower box are connected to each other with a bolt.

* * * * *